(12) United States Patent
Zhang et al.

(10) Patent No.: US 11,671,092 B2
(45) Date of Patent: Jun. 6, 2023

(54) FAST STARTUP TECHNIQUE AND CIRCUIT FOR A RECEIVER

(71) Applicant: NXP USA, Inc., Austin, TX (US)

(72) Inventors: Xu Zhang, Chandler, AZ (US); Siamak Delshadpour, Phoenix, AZ (US); David Edward Bien, Glendale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/475,965

(22) Filed: Sep. 15, 2021

(65) Prior Publication Data

US 2023/0079861 A1 Mar. 16, 2023

(51) Int. Cl.
*H03K 17/56* (2006.01)
*H03K 19/20* (2006.01)

(52) U.S. Cl.
CPC ............ *H03K 17/56* (2013.01); *H03K 19/20* (2013.01)

(58) Field of Classification Search
CPC ............................... H03K 17/56; H03K 19/20
See application file for complete search history.

(56) References Cited

U.S. PATENT DOCUMENTS

| 7,394,293 B1 * | 7/2008 | Waldrip | H03K 19/01721 326/83 |
| 7,397,226 B1 | 7/2008 | Mannama et al. | |
| 8,289,257 B1 * | 10/2012 | Simon | G09G 3/3611 330/69 |
| 10,439,566 B2 * | 10/2019 | Sun | H03F 3/211 |
| 10,691,150 B1 | 6/2020 | Delshadpour et al. | |
| 2011/0274290 A1 | 11/2011 | Holzmann et al. | |
| 2012/0007680 A1 * | 1/2012 | Hijikata | H03F 1/3205 330/278 |
| 2012/0083224 A1 * | 4/2012 | Visser | H04B 1/525 455/83 |
| 2013/0195291 A1 | 8/2013 | Josefsson | |
| 2020/0106260 A1 * | 4/2020 | Telefus | H02H 3/10 |

OTHER PUBLICATIONS

Lin, Zhihong; Texas Instruments; Understanding the Embedded USB2 (eUSB2) Standard; retrieved from the Internet https://e2e.ti.com/blogs_/b/analogwire/posts/understanding-embedded-usb2-eusb2; 3 pages (Aug. 19, 2019).

* cited by examiner

*Primary Examiner* — John W Poos
*Assistant Examiner* — Tyler J Pereny

(57) ABSTRACT

Various embodiments relate to a receiver, including: a first bias circuit configured to bias a first and second transistor based upon an bias enable signal and a receive enable signal; a first node between the first transistor and a third transistor; a second node between the second transistor and a fourth transistor; and a second bias circuit configured to bias the first node and the second node based upon the bias enable signal, wherein the third transistor is connected to a first differential output and the gate of the third transistor is connected to a first differential input, and wherein the fourth transistor is connected to a second differential output and the gate of the fourth transistor is connected to a second differential input.

14 Claims, 3 Drawing Sheets

US 11,671,092 B2

FAST STARTUP TECHNIQUE AND CIRCUIT FOR A RECEIVER

TECHNICAL FIELD

Various exemplary embodiments disclosed herein relate generally to fast startup techniques and circuits for receivers such as those in repeaters such as a eUSB/USB repeater.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a receiver, including: a first bias circuit configured to bias a first and second transistor based upon an bias enable signal and a receive enable signal; a first node between the first transistor and a third transistor; a second node between the second transistor and a fourth transistor; and a second bias circuit configured to bias the first node and the second node based upon the bias enable signal, wherein the third transistor is connected to a first differential output and the gate of the third transistor is connected to a first differential input, and wherein the fourth transistor is connected to a second differential output and the gate of the fourth transistor is connected to a second differential input.

Various embodiments are described, wherein second bias circuit includes: a fifth transistor, a current source, and a second switch connected in series between a voltage source and a ground, wherein the gate of the fifth transistor is connected to the second current source; and a driver/bias generation circuit connected between the gate of the fifth transistor and the first node and the second node, wherein the second switch is controlled by the bias enable signal.

Various embodiments are described, wherein the driver/bias generation circuit includes a sixth transistor connected between the voltage source and the first node having a gate connected to the gate of the fifth transistor; and a seventh transistor connected between the voltage source and the second node having a gate connected to the gate of the fifth transistor.

Various embodiments are described, further including: a capacitor connected between the first node and the second node; and a resistor network connected between the first node and the second node.

Various embodiments are described, wherein the receiver is in an idle mode when the bias enable signal is enabled.

Various embodiments are described, wherein the first transistor and the second transistor are off when the receive enable signal is disabled.

Various embodiments are described, wherein the first transistor and the second transistor are on when the receive enable signal is enabled and the bias enable signal is enabled.

Further various embodiments relate to a transmit driver, including: a bias circuit configured to produce a bias current based upon an bias enable signal; a first driver circuit configured to receive a differential input signal and to drive a differential output signal, wherein the first driver circuit is biased by the bias circuit; a logic circuit configured to produce a pull down signal based upon the differential input signal and a transmit enable signal; and a pull down circuit configured to pull down the internal nodes of first driver circuit based upon the pull down signal.

Various embodiments are described, wherein the first driver circuit includes a first transistor connected between the bias circuit and a first differential output of the transmit driver wherein the gate of the first transistor is connected to a first differential input of the transmit driver, and a second transistor connected between the bias circuit and a second differential output of the transmit driver wherein the gate of the second transistor is connected to a second differential input of the transmit driver.

Various embodiments are described, wherein the pull down circuit includes a third transistor connected between the bias circuit and ground wherein the gate of the third transistor is connected to the logic circuit and wherein when the pulldown signal is enabled the third transistor is on and pulls the bias current to the ground.

Various embodiments are described, wherein the logic circuit includes a NOR gate connected the first differential input and the second differential input, and an AND gate connected to the output of the NOR gate and the transmit enable signal wherein the AND gate produces the pull down signal.

Various embodiments are described, further including a second driver circuit configured to receive a delayed differential input signal and to drive a differential output signal in combination with the first driver circuit, wherein the second driver circuit is biased by the bias circuit based upon the bias enable signal Various embodiments are described, wherein the second driver circuit includes a fourth transistor connected between the second bias circuit and a first differential output of the transmit driver wherein the gate of the fourth transistor is connected to a first delayed differential input of the transmit driver, and a fifth transistor connected between the bias circuit and a second differential output of the transmit driver wherein the gate of the fifth transistor is connected to a second delayed differential input of the transmit driver.

Various embodiments are described, wherein pull down circuit pulls down the internal nodes of first driver circuit when the transmit enable signal is enabled and when there is no differential input signal.

Further various embodiments relate to a repeater, including: a receiver including a first bias circuit configured to bias a first and second transistor based upon an bias enable signal and a receive enable signal; a first node between the first transistor and a third transistor; a second node between the second transistor and a fourth transistor; and a second bias circuit configured to bias the first node and the second node based upon the bias enable signal, wherein the third transistor is connected to a first differential output and the gate of the third transistor is connected to a first differential input, and wherein the fourth transistor is connected to a second differential output and the gate of the fourth transistor is connected to a second differential input; and a transmitter, including: a third bias circuit configured to produce a bias current based upon an bias enable signal; a first driver circuit configured to receive a differential input signal and to drive a differential output signal, wherein the first driver circuit is biased by the third bias circuit; a logic circuit configured to produce a pull down signal based upon the differential input signal and a transmit enable signal; and a pull down circuit configured to pull down the internal nodes of the first driver circuit based upon the pull down signal.

Various embodiments are described, wherein second bias circuit includes: a fifth transistor, a current source, and a second switch connected in series between a voltage source and a ground, wherein the gate of the fifth transistor is connected to the current source; and a driver/bias generation circuit connected between the gate of the firth transistor and the first node and the second node, wherein the second switch is controlled by the bias enable signal.

Various embodiments are described, wherein the driver/bias generation circuit includes a sixth transistor connected between the voltage source and the first node having a gate connected to the gate of the fifth transistor; and a seventh transistor connected between the voltage source and the second node having a gate connected to the gate of the fifth transistor.

Various embodiments are described, wherein the first driver circuit includes a fifth transistor connected between the bias circuit and a first differential output of the transmit driver wherein the gate of the fifth transistor is connected to a first differential input of the transmit driver, and a sixth transistor connected between the bias circuit and a second differential output of the transmit driver wherein the gate of the sixth transistor is connected to a second differential input of the transmit driver.

Various embodiments are described, wherein the pull down circuit includes a seventh transistor connected between the bias circuit and ground wherein the gate of the third transistor is connected to the logic circuit and wherein when the pulldown signal is enabled the seventh transistor is on and pulls the bias current to the ground.

Various embodiments are described, wherein the logic circuit includes a NOR gate connected the first differential input and the second differential input, and an AND gate connected to the output of the NOR gate and the transmit enable signal wherein the AND gate produces the pull down signal.

Various embodiments are described, further including a second driver circuit configured to receive a delayed differential input signal and to drive a differential output signal in combination with the first driver circuit, wherein the second driver circuit is biased by the third bias circuit

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
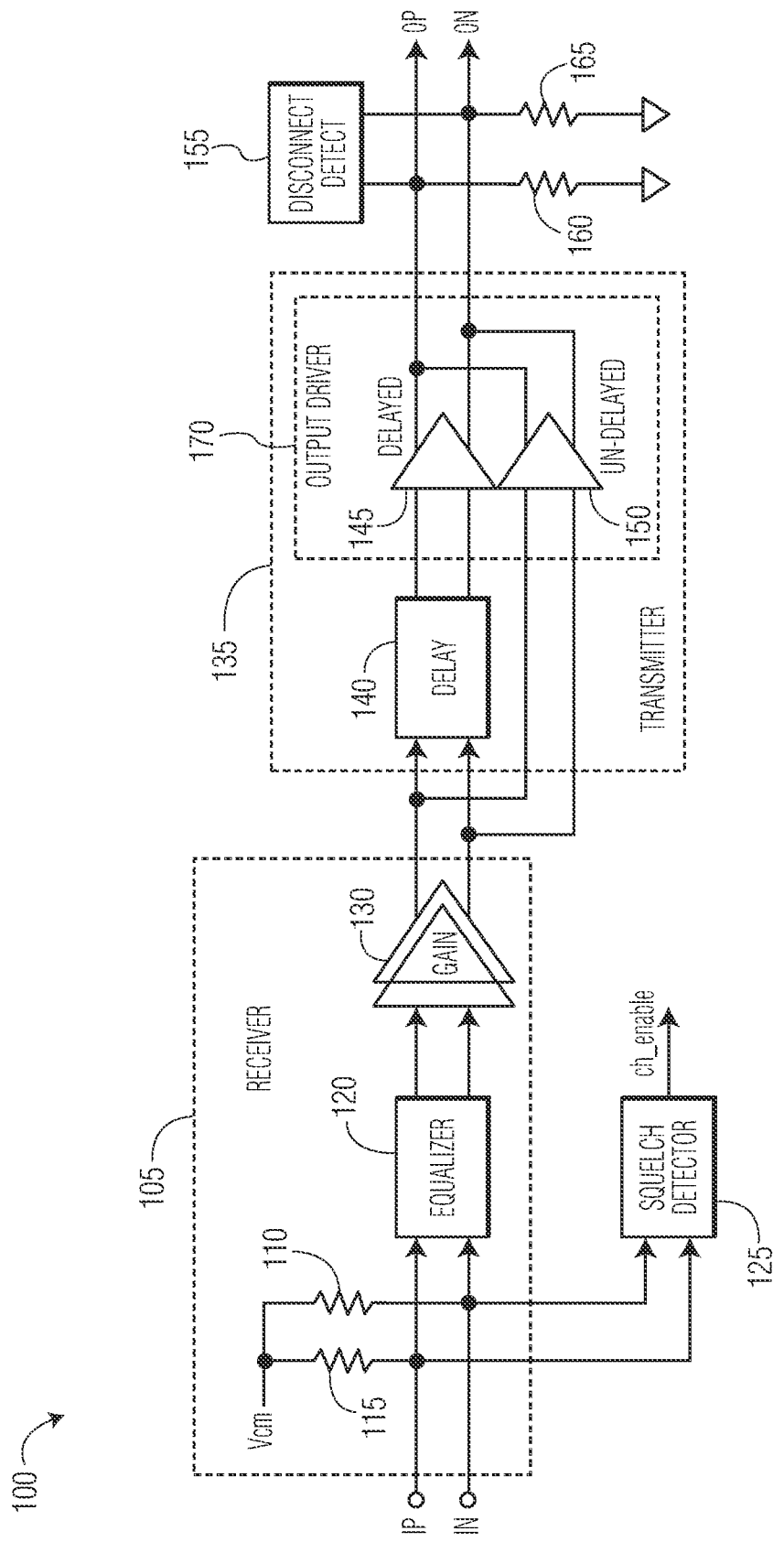
FIG. 1 illustrates a standard repeater/redriver architecture with a de-emphasis feature.

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

The embedded USB2 (eUSB2) specification is a supplement to the USB2.0 specification that addresses issues related to interface controller integration with advanced system-on-chip (SoC) process nodes by enabling USB2.0 interfaces to operate at I/O voltages of 1V or 1.2V instead of a traditional 3.3V supply. eUSB2 can enable smaller, more power-efficient SoCs, in turn enabling process nodes to continue to scale while increasing performance in applications such as smartphones, tablets and notebooks.

As applications like smartphones and tablets continue to pack more and more components into smaller form factors, it is essential that interfaces shrink as well. However, the continued shrinking of SoC node size has led to a thinner gate oxide that can only support lower voltages. For devices relying on USB2.0 interfaces, this trend can lead to complicated design challenges for advanced process nodes.

When process nodes reach 7 nm, quantum effects begin impacting high-signaling-voltage inputs/outputs (IOs) such as 3.3V and can no longer be easily supported. Many device-to-device interfaces already support low signaling voltages, but USB2.0 still requires a 3.3V I/O voltage to operate.

USB2.0 has been the most successful wired interface in the past 20 years, and almost all SoCs today are equipped with the USB2.0 interface. USB standards evolution kept the original 3.3V I/O USB 1.0 interface intact for backward compatibility, helping enable wider adoption and a larger ecosystem while also preserving device interoperability.

As process nodes approach smaller features (e.g. 5 nm), the manufacturing cost to maintain USB2.0 3.3V I/O signaling has grown exponentially. eUSB2 addresses the I/O voltage gap as a physical layer supplement to the USB2.0 specification so that designers can integrate the eUSB2 interface at the device level while leveraging and reusing the USB2.0 interface at the system level.

eUSB2 can support onboard inter-device connectivity through direct connections as well as exposed connector interfaces through an eUSB2-to-USB2.0/USB2-to-eUSB2 repeater, to perform level shifting While USB2.0 can continue to be integrated into SoCs with process features of 7 nm and above, eUSB2 is a good fit for SoCs when process features are 5 nm and below. eUSB2 can also be integrated into other devices to easily interconnect with SoCs as a device-to-device interface. USB2.0 will continue serving as the standard connector interface.

eUSB2 allows significant I/O power reduction and improves power efficiency, while enabling process features to continue to scale.

A USB2/eUSB2 repeater includes a USB2 port and an eUSB2 port. Bidirectional traffic may be carried by the repeater include low speed (LS), full speed (FS), and high speed (HS) traffic. The repeater may have different voltage domains that serve the different ports. For example, a 1.8V source may be used to power the circuits related to the eUSB2 port, and a 3.3V source may be used to power the circuits related to the USB2 port. Each of the USB2 pins faces ~3.6V voltage in LS/FS mode and <1.1V signal in HS mode (0.44V in functional mode and <1.1V in chirp mode), so it is assumed that the maximum signal in each of the USB2 pins during the HS-RX mode will be 1.1V). Alternatively 1.2V or 1.0V supply can be used to support operations on the eUSB port.

The eUSB/USB2 specification allows a repeater/hub to consume up to 4 UI of sync bits during startup. Typically, the signal path that includes a receiver and a transmitter is enabled by a squelch detector at the receiver side. A high speed squelch detector may have a response time of 2 UI to the first edge of the sync bits. It then enables the receiver and the transmitter with a minimum delay and a minimum amount of digital processing. As a result, the receiver and the transmitter are required to start normal operation within 2 UI time, which is approximately 4 ns. Traditional implementations may maintain the normal biasing and operation of receiver and transmitter to meet the 2 UI (excluding squelch detector) or 4 UI (including squelch detector) specification, as the signal path is not turned off at all even when there is no valid signal at the receiver as indicated by the squelch detector. However, there is a huge power penalty associated with this implementation.

The embodiments described here include circuit design methods and fast startup capable circuits to speed up the startup of eUSB/USB2 repeater. As the signal path of eUSB/USB2 repeater includes mainly a receiver and a transmitter, the most important sub-blocks for fast startup are the first stage of the receiver and the output driver of the transmitter. A significant portion of the bias current is enabled for these blocks when they are in idle mode to accomplish fast transitioning and settling once enabled. Inside the first stage of the receiver, the source terminals of the input pair are pre-charged, especially when equalization is incorporated in this stage and large capacitive loads are expected due to the source degeneration implementation. As for the output driver, the internal sides or drain terminals of the output devices are discharged/pulled down to ground to speed up the settling of the nodes after the driver is enabled. As a result, the receiver and transmitter path can have a combined startup time of less than 4 ns.

The embodiments described herein are applicable to USB2, eUSB and any other communication circuits/standards that desire to achieve fast startup of the receiver and transmitter path.

FIG. 1 illustrates a standard repeater/redriver architecture with a de-emphasis feature. The repeater/redriver 100 includes a receiver 105 and a transmitter 135. The receiver includes dual inputs IP (input positive) and IN (input negative). The inputs IP and IN may be connected to termination resistors 115 and 110 respectively. A squelch detector 125 may be connected to the inputs as well to produce a squelch signal to indicate if a valid data input is available. The squelch detector output is either directly or lightly buffered/processed to turn on the receiver and the transmitter. When there is no active signal presented at the receiver input, the squelch detector 125 turns off the receiver and the transmitter and this is referred to as the idle mode. On the other hand, the squelch detector 125 enables the receiver and the transmitter when valid data is available. This mode is referred as the active mode.

An equalizer 120 may receive the inputs IP and IN and provide an equalized output to gain stages 130 that act as a slicer. The equalizer 120 may be a continuous time linear equalizer (CTLE). In other situations, the equalizer 120 may be replaced with a buffer or current mode logic (CML) stage when receiver equalization is not needed.

The transmitter 135 includes an delay cell 140, an output driver 170 including line drivers 145, 150, a disconnect detector 155, and termination resistors 160, 165. The delay cell 140 helps to make an feed-forward equalizer (FFE). The delay cell 140 produces a delayed version of the input signal. The delayed signal is fed into a line driver 145. The non-delayed signal from the gain stage 130 is fed into a line driver 150. The outputs of the line drivers 145, 150 are combined to produce output signals OP (output positive) and ON (output negative). The output and input termination resistor values may be selected based upon the specific application. The disconnect detector 155 detects when the outputs are disconnected and may not be present in different applications.

The equalizer 120 removes most of the inter-symbol interference (ISI) that is introduced by the transmission channel at its input. The gain stages 130 that (may) act as a slicer make a non-linear hard decision and sets the equalized signal to either high or low. This avoids propagation of amplitude noise and allows regeneration of pre-emphasis, but turns residual ISI into non-equalizable timing jitter.

The transmitter 135 uses the delay cell cells of 140 and line drivers 145, 150 to (pre/de) emphasis the transmitted signal. The output signal of the transmitter 135 is a weighted sum of the input signal and the signal delayed by one unit interval (UI). The delayed signal is used to compensate the ISI. The weight of the delayed signal decides the equalizer gain of the transmitter 135, and its optimum value varies with different applications. The illustrated example uses one UI, but the delay may be a different value instead of one (e.g., 0.25 UI, 0.5 UI, 0.75 UI a fixed or programmable value) depending on the application and system requirement.

In other embodiments, the delay cell 140 and the output driver 145 for the delayed path may be removed. The embodiments and techniques disclosed herein may be revised to apply in these applications as well.

The eUSB/USB receiver and transmitter path may be disabled to save power when there is no active input data at the receiver. On the other hand, the signal path may be turned on fast enough to guarantee normal operation when data comes. It is low complexity which makes it efficient for an industrial chip.

In the embodiments described herein, static biasing is optimized for each stage in the path. Critical internal nodes are pre-charged in the first stage of the receiver. To speed up the settling of critical nodes inside the output driver, an explicit pull-down path is available to set optimized initial values for these nodes.

To be able to partially disable receiver and transmitter for power saving purpose, the receiver and the transmitter are required to be operational within 2 ns after they are enabled as discussed above. Static bias currents for each stage are to be optimized. Typically, 20%-40% of the total block current is required for static biasing to guarantee the fast startup of the whole signal path. The first stage of the receiver and the output driver of the transmitter are the most important blocks with regard to the whole signal path startup time. The first stage delays the response for all stages if not properly optimized. On the other hand, the output driver is typically the block with highest self and external loadings due to the currents and loading conditions it is required to handle. Thus, the startup time of the block will be a significant portion of the total startup time.

Figure 2:
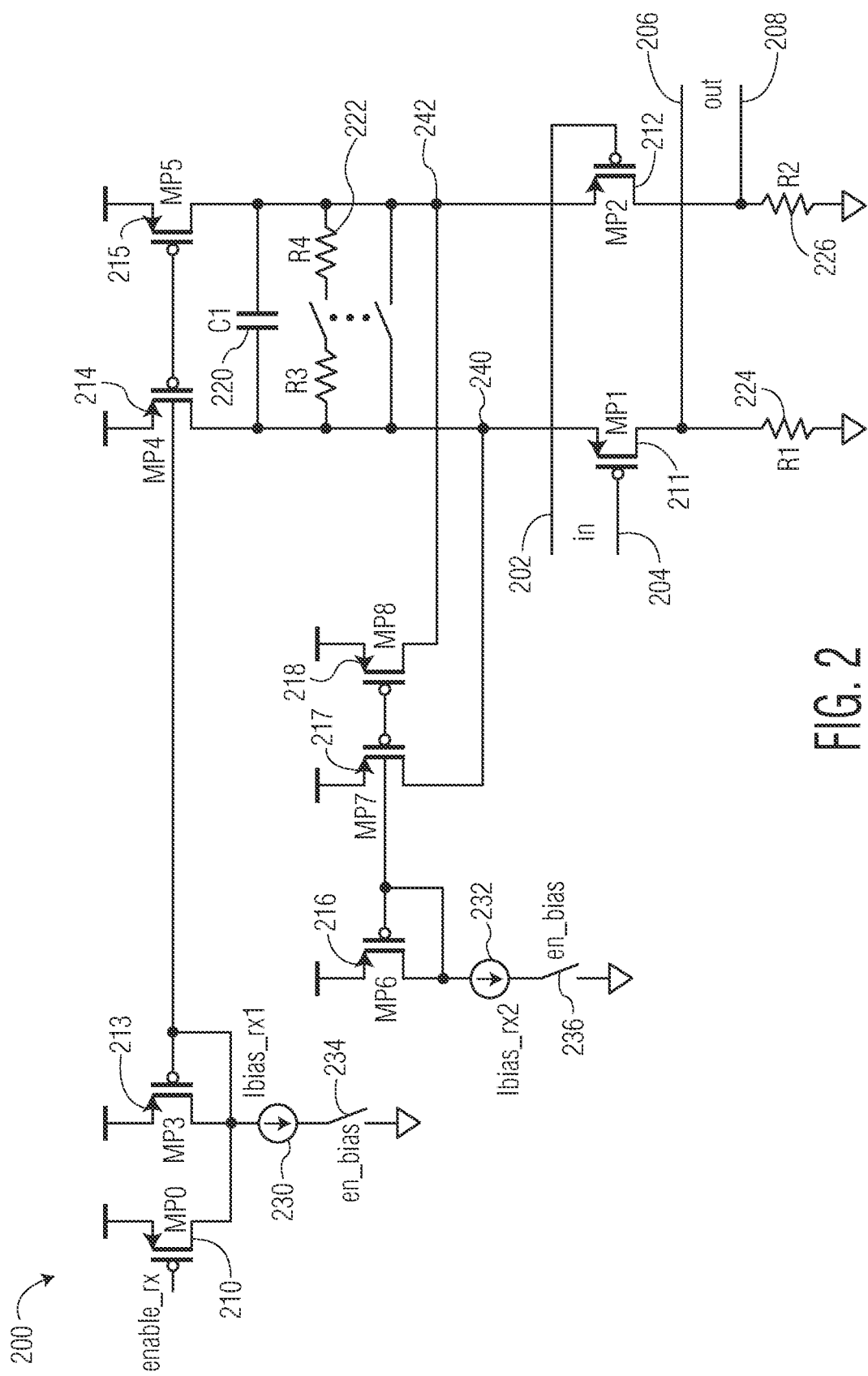
FIG. 2 illustrates an example of a first stage of the receiver with equalization, which is capable of fast startup.

FIG. 2 illustrates an example of a first stage of the receiver with equalization, which is capable of fast startup. The first stage of the receiver 200 includes transistors MP1 211, MP2 212, MP4 214, and MP5 215. MP4 214 is connected in series with MP1 211 and resistor R1 224 between a source voltage and ground. MP5 215 is connected in series with MP2 212 and resistor R2 226 between a source voltage and ground. A first node 240 is between MP4 214 and MP1 211, and a second node 242 is between MP5 215 and MP2 212. A capacitor C1 220 and a resistor network 222 are connected in parallel between first node 240 and second 242. The resistor network 222 may include switches that allow for various resistance values to be selected. In some embodiments, the resistor network may include a single resistor. The capacitor 220 and resistor network 222 provide equalization to the input signal.

The input signal is received on differential input lines 202, 204 that are connected to the gates of MP1 211 and MP2 212, respectively. The output signal is output on lines 206, 208. The output line 206 is connected to a node between MP1 211 and R1 224, and the output line 208 is connected to a node between MP2 212 and R2 226. When an input signal is received on the input lines 202, 204, they control the state of the transistors MP1 211 and MP2 212, respectively. As MP1 211 and MP2 212 are turned on and off, the respective output lines 206 and 208 receive signals corresponding to the input signals on the input lines 202 and 204. Further, MP4 214 and MP5 215 provide bias current for MP1 211 and MP2 212 from the source voltage whose value is modified by the C1 220 and resistor network 222.

A first bias circuit includes transistors MP0 210 and MP3 213, current source 230, and switch 234. The first bias circuit provides a bias voltage to the gates of MP4 214 and MP5 215. MP0 210 is connected between the voltage source and the current source 230 with its gate connected to a receive enable signal enable_rx. The transistor MP3 213 is connected between the voltage source and the current source 230 with its gate connect to the gates of MP4 214 and MP5 215 and a node between MP3 213 and the current source 230. The switch 234 is controlled by a bias enable signal en_bias that allows current to flow through the current source 230 when closed.

A second bias circuit includes transistors MP6 216, MP7 217, MPP8 218, current source 232, and switch 236. The second bias circuit provides a bias voltage to the first node 240 and the second node 242. MP6 216 is connected between the voltage source and the current source 232 with its gate connected to the gates of MP7 217 and MP8 218 and a node between MP6 216 and the current source 232. The transistor MP7 217 is connected between the voltage source and the node 240, with its gate connected to the gate of MP6 216. The transistor MP8 218 is connected between the voltage source and the node 242, with its gate connected to the gate of MP6 216. The switch 236 is controlled by the bias enable signal en_bias that allows current to flow through the current source 232 when closed.

In the idle mode, en_bias is at logic high. When en_bias is at logic low, the first stage of the receiver 200 is completely off and is in the off mode. The receiver is not ready for either fast startup or any valid data input. Fast startup requires that the first receiver stage 200 is in the idle mode. When enable_rx is at logic low and en_bias is at logic high, a bias current Ibias_rx1 from the current supply 230 passes through MP0 210 instead of MP3 213. Thus, MP4 214 and MP5 215 are turned off to save current as their gate voltages are close to supply voltage.

When enable_rx transitions to logic high, Ibias_rx1 passes through MP3 213 to quickly set the gate voltages of MP3 213, MP4 214, and MP5 215. On the other hand when en_bias is at logic high, the bias current Ibias_rx2, MP6 216, MP7 217, and MP8 218 pre-charge the source voltages of MP1 211 and MP2 212 in idle mode, which significantly shortens the settling times of the devices connected to the source terminals of MP1 211 and MP2 212.

The source terminals of MP1 211 and MP2 212 may see extra capacitive loadings compared to following gain stages as MP1 211, MP2 212 and MP4 214, MP5 215 are typically larger in size to have reasonable gain at the first stage of the receiver. The capacitive loadings may be greater especially when source degeneration is implemented for equalization. To speed up settling with these loadings, the pre-charging helps to ensure fast startup. Ibias_rx2 or currents for the pre-charging can be a fraction of Ibias_rx1 to save idle power.

Figure 3:
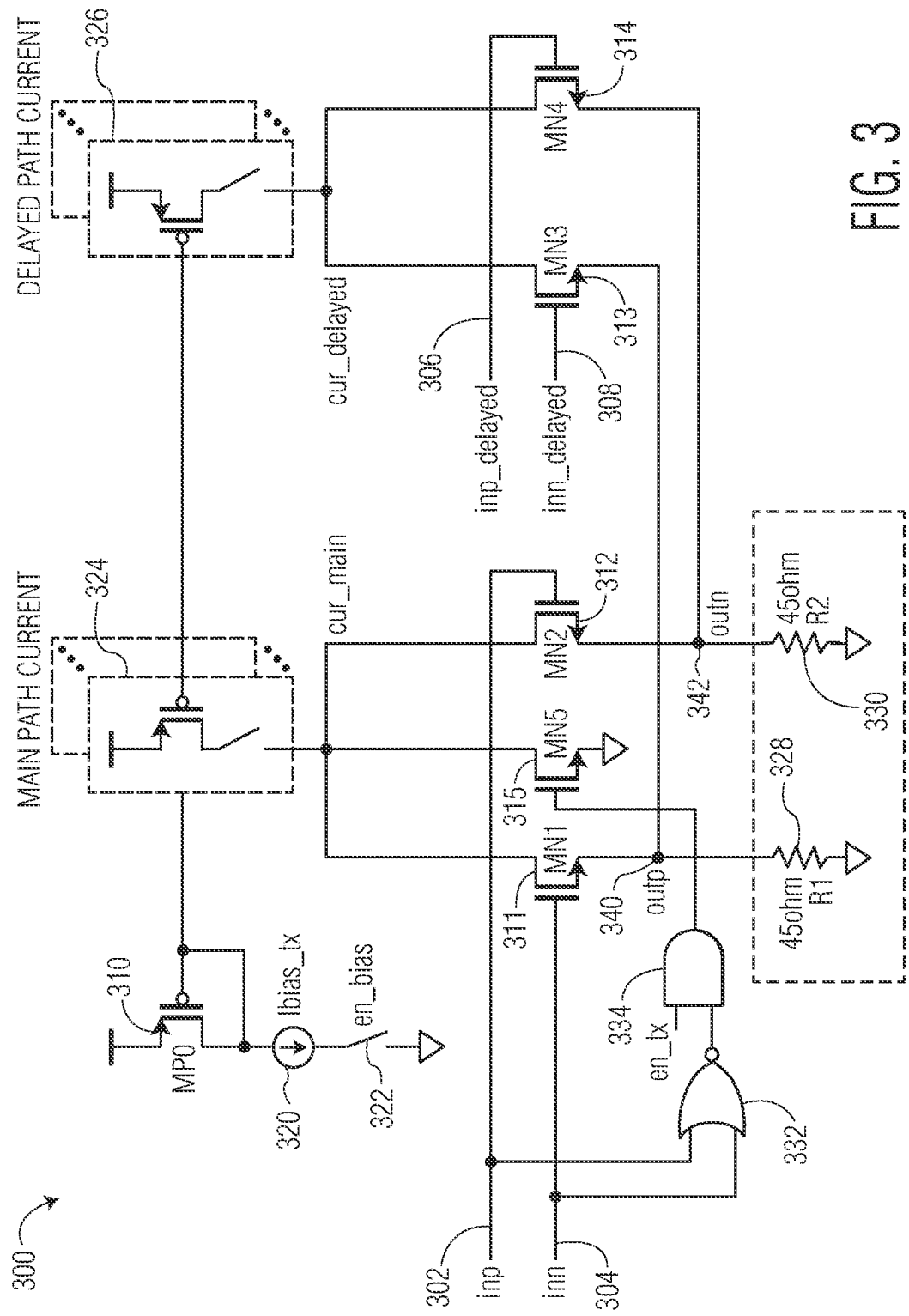
FIG. 3 illustrates an output driver with a fast start up capability.

FIG. 3 illustrates an output driver with a fast start up capability. The output driver 300 may be the same as output driver 170 in FIG. 1. The output driver 300 includes a main line driver that is not delayed including transistors MN1 311, MN2 312, and MN5 315. MN1 311 is connected between a main path bias current generator 324 and an output 340. The gate of MN1 311 is connected to the input 304, so that the output of MNI1 311 follows the input 304. Likewise, MN2 312 is connected between the main path bias current generator 324 and an output 342. The gate of MN2 312 is connected to the input 302, so that the output of MN2 312 follows the input 302. The bias current generator 324 is switched on/off by en_tx signal.

The main line driver also includes a pull down transistor MN5 215 that is connected between the main path bias current generator 324 and ground. The gate of MN5 315 is connected to the output of an AND gate 334. The AND gate 334 receives a transmit enable signal en_tx and the output of NOR gate 332. The NOR gate 332 is connected to inputs 302 and 304. As a result, when valid data does not reach the inputs 302 and 304, both inputs are at logic low and en_tx is at logic high at the very beginning of fast startup, the transistor MN5 315 is turned on so that the bias current is pulled low to speed up settling of the nodes of the driver after it is enabled. Once valid data reaches the inputs 302 and 304, NOR gate 332 outputs logic low and turns off the discharge path from MN5 315 via NAND gate 334.

The output driver 300 also includes a delayed line driver that includes transistors MN3 313 and MN4 314. MN3 313 is connected between a delayed path bias current generator 326 and the output 340. The gate of MN3 313 is connected to the delayed input 308, so that the output of MNI3 313 follows the delayed input 308. Likewise, MN4 314 is connected between the delayed path bias current generator 326 and an output 342. The gate of MN4 314 is connected to the delayed input 306, so that the output of MN4 314 follows the delayed input 306. The bias current generator 326 is switched on/off by en_tx signal The outputs 340, 342 are connected to ground through resistors R1 328 and R2 330, respectively. The values of resistors R1 328 and R2 330 are selected based upon the specific application.

When the transmit driver 300 is in idle mode, en_bias is at logic high. A pullup transistor such as MP0 310 in FIG. 2 is not needed as all inputs inp 302, inn 304, inp_delayed 306, and inn_delayed 308 are all grounded during the idle mode. Thus, there is no active current in the main path or the delayed path as each transistor MN1 311, MN2 312, MN3 313, and MN4 314 is off. When the output driver is enabled by en_tx transitioning to logic high, current in the main path from the bias current generator starts to pull the drains of MN 1 311 and MN2 312 towards supply before any data reaches the inputs. Once valid data comes, which causes either inp 302 or inn 304 to be at logic high, the pull-down on the main current path is disabled and starts to settle to its mean value in active mode. Without the pull-down on main path, the initial value of the net will be at supply level instead of close to 0 or ground. Given that the nominal current in the main path produces a mean voltage value of around 0.4V in active mode, settling of main path from supply to 0.4V takes much longer time than settling from ground. This is the reason why the pull-down accelerates the settling. The delayed path may also have a similar pull-down transistor, but such a pull down transistor is not included in FIG. 3 as the delayed path typically allows more time for the delayed path current to settle. In addition, MN3 313, MN4 314, and devices associated with the delayed path may be simply removed for an implementation without transmitter pre/de-emphasis.

FIG. 2 illustrates an implementation with a PMOS input differential pair. This implementation may be easily revised to accommodate an NMOS input differential pair.

The proposed embodiments may be used for USB2, eUSB, or any other communication circuits/standards that desire to achieve fast startup of the receiver and transmitter path.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A transmit driver, comprising:
   a bias circuit configured to produce a bias current based upon a bias enable signal;
   a first driver circuit configured to receive a differential input signal and to drive a differential output signal, wherein the first driver circuit is biased by the bias circuit;
   a logic circuit configured to produce a pull down signal based upon the differential input signal and a transmit enable signal; and
   a pull down circuit configured to pull down one or more internal nodes of first driver circuit based upon the pull down signal.

2. The transmit driver of claim 1, wherein the first driver circuit includes
   a first transistor connected between the bias circuit and a first differential output of the transmit driver wherein a gate of the first transistor is connected to a first differential input of the transmit driver, and
   a second transistor connected between the bias circuit and a second differential output of the transmit driver wherein a gate of the second transistor is connected to a second differential input of the transmit driver.

3. The transmit driver of claim 2, wherein the pull down circuit includes a third transistor connected between the bias circuit and ground wherein a gate of the third transistor is connected to the logic circuit and wherein when the pull down signal is enabled the third transistor is on and pulls the bias current to the ground.

4. The transmit driver of claim 3, wherein the logic circuit includes
   a NOR gate connected the first differential input and the second differential input, and
   an AND gate connected to an output of the NOR gate and the transmit enable signal wherein the AND gate produces the pull down signal.

5. The transmit driver of claim 1, further comprising
   a second driver circuit configured to receive a delayed differential input signal and to drive a differential output signal in combination with the first driver circuit, wherein the second driver circuit is biased by the bias circuit based upon the bias enable signal.

6. The transmit driver of claim 5, wherein the second driver circuit includes
   a second bias circuit,
   a fourth transistor connected between the second bias circuit and a first differential output of the transmit driver wherein a gate of the fourth transistor is connected to a first delayed differential input of the transmit driver, and
   a fifth transistor connected between the second bias circuit and a second differential output of the transmit driver wherein a gate of the fifth transistor is connected to a second delayed differential input of the transmit driver.

7. The transmit driver of claim 1, wherein pull down circuit pulls down the one or more internal nodes of first driver circuit when the transmit enable signal is enabled and when there is no differential input signal.

8. A repeater, comprising:
   a receiver including
      a first bias circuit configured to bias a first and second transistor based upon a bias enable signal and a receive enable signal;
      a first node between the first transistor and a third transistor;
      a second node between the second transistor and a fourth transistor; and
      a second bias circuit configured to bias the first node and the second node based upon the bias enable signal,
      wherein the third transistor is connected to a first differential output and a gate of the third transistor is connected to a first differential input, and
      wherein the fourth transistor is connected to a second differential output and a gate of the fourth transistor is connected to a second differential input; and
   a transmitter, comprising:
      a third bias circuit configured to produce a bias current based upon the bias enable signal;
      a first driver circuit configured to receive a differential input signal and to drive a differential output signal, wherein the first driver circuit is biased by the third bias circuit;
      a logic circuit configured to produce a pull down signal based upon the differential input signal and a transmit enable signal; and
      a pull down circuit configured to pull down one or more internal nodes of the first driver circuit based upon the pull down signal.

9. The repeater of claim 8, wherein the second bias circuit comprises:
   a fifth transistor, a current source, and a second switch connected in series between a voltage source and a ground, wherein a gate of the fifth transistor is connected to the current source; and
   a driver/bias generation circuit connected between a gate of the first transistor and the first node and the second node, wherein the second switch is controlled by the bias enable signal.

10. The repeater of claim 9, wherein the driver/bias generation circuit comprises
- a sixth transistor connected between the voltage source and the first node having a gate connected to the gate of the fifth transistor; and
- a seventh transistor connected between the voltage source and the second node having a gate connected to the gate of the fifth transistor.

11. The repeater of claim 9, wherein the first driver circuit includes
- a sixth transistor connected between the driver/bias generation circuit and a first differential output of the first driver circuit wherein a gate of the sixth transistor is connected to a first differential input of the first driver circuit, and
- a seventh transistor connected between the driver/bias generation circuit and a second differential output of the first driver circuit wherein a gate of the seventh transistor is connected to a second differential input of the first driver circuit.

12. The repeater of claim 11, wherein the pull down circuit includes
- an eighth transistor connected between the driver/bias generation circuit and ground wherein the gate of the seventh transistor is connected to the logic circuit and, when the pull down signal is enabled, the seventh transistor is on and pulls the bias current to the ground.

13. The repeater of claim 12, wherein the logic circuit includes
- a NOR gate connected the first differential input and the second differential input, and
- an AND gate connected to an output of the NOR gate and the transmit enable signal wherein the AND gate produces the pull down signal.

14. The repeater of claim 9, further comprising
- a second driver circuit configured to receive a delayed differential input signal and to drive a differential output signal in combination with the first driver circuit, wherein the second driver circuit is biased by the third bias circuit.

* * * * *